United States Patent [19]

Lippl

[11] Patent Number: 4,737,721
[45] Date of Patent: Apr. 12, 1988

[54] FREQUENCY DOUBLING CIRCUIT FOR OUT-OF-PHASE, INCREMENTAL PULSES OF AN ANGULAR STEP GENERATOR

[75] Inventor: Friedrich Lippl, Erling-Andechs, Fed. Rep. of Germany

[73] Assignee: Siemens Aktiengesellschaft, Berlin and Munich, Fed. Rep. of Germany

[21] Appl. No.: 85,040

[22] Filed: Aug. 13, 1987

[30] Foreign Application Priority Data

Sep. 2, 1986 [DE] Fed. Rep. of Germany ....... 3629829

[51] Int. Cl.$^4$ .......................................... H03K 5/156
[52] U.S. Cl. ..................................... 328/20; 307/261; 328/29; 328/62; 328/158
[58] Field of Search ..................... 363/157; 328/20, 29, 328/158, 62; 307/261

[56] References Cited

U.S. PATENT DOCUMENTS 4,359,688 11/1982 Haville ................................. 328/20
4,390,865 6/1983 Lauro .

FOREIGN PATENT DOCUMENTS 60-14117 6/1985 Japan .
524294 10/1976 U.S.S.R. ................................ 328/20
1166265 7/1985 U.S.S.R. ................................ 328/20

OTHER PUBLICATIONS

Publication from Components Report XIII (1978) No. 1, Entitled "A New Optoelectronic Incremental Encoder for Control Applications" by Viktor Wendler, pp. 1–5.

*Primary Examiner*—William H. Beha, Jr.
*Attorney, Agent, or Firm*—Jeffrey P. Morris

[57] ABSTRACT

The invention relates to a frequency doubling circuit for the sinusoidal and cosinusoidal signals emitted by an angular step generator. According to the invention, four comparators are provided, while the sinusoidal signal is located at the non-inverting inputs of the first and the second comparator, the inverted sinusoidal signal is located at the inverting input of the first comparator and at the non-inverting input of the fourth comparator, the cosinusoidal signal at the non-inverting input of the third comparator, and the inverted cosinusoidal signal at the inverting inputs of the second to fourth comparator. Further, two XOR gates are provided, while the outputs of the first and third comparator are located at the inputs of the first XOR gate and the outputs of the second and fourth comparator are located at the inputs of the second XOR gate.

2 Claims, 1 Drawing Sheet

FREQUENCY DOUBLING CIRCUIT FOR OUT-OF-PHASE, INCREMENTAL PULSES OF AN ANGULAR STEP GENERATOR

BACKGROUND OF THE INVENTION

1. Field of the Invention

The present invention relates to the field of frequency doubling circuits for sinusoidal and cosinusoidal signals emitted by an angular step generator.

2. Description of the Prior Art

The prior art publication "A New Optoelectronic Angular Step Generator for Control Tasks" of the "Component Report" 16 (1978), issue 1, pp. 1–5, describes the basic functioning of an angular step generator. With such an angular step generator, two 90° out-of-phase sinusoidal or cosinusoidal signals can be tapped. These signals are generated by the optical scanning of an impulse disk which is provided with slots. The resolution capacity of such an angular step generator is dependent upon the number of dashes or slots on the impulse disk.

As a measure for increasing the resolution, it is known in the prior art that the sinusoidal and cosinusoidal signals are respectively transformed into a square-wave signal. These signals, as well as their complementary pulses, pass through four monostable multivibrators which transform each falling edge of one of the pulses into an impulse of defined length. This then creates a series of impulses of equal duration. This configuration, however, does not produce an output signal with a 1:1 pulse duty factor.

It is therefore possible to increase the diameter of the impulse disks, so as to increase the number of markings. However, this measure increases the space requirements as well as the costs.

It is the object of the present invention to increase the resolution of an angular step generator, while the output pulse maintains a 1:1 pulse duty factor.

SUMMARY OF THE INVENTION

The frequency doubling circuit according to the present invention offers the advantage of generating via an exclusive or gate two out-of-phase 90° output signals with a 1:1 pulse duty factor, which are derived from noninverted and inverted sinusoidal and cosinusoidal signals applied to four comparators.

DESCRIPTION OF THE PREFERRED EMBODIMENT

Figure 1:
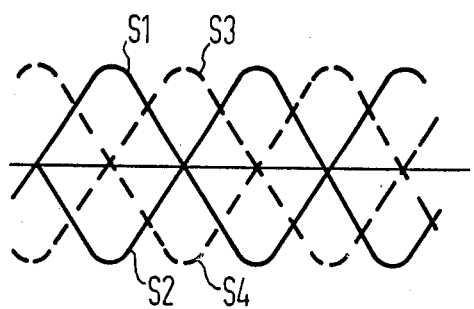
FIG. 1 shows the sinusoidal output signals of the angular step generator.
Figure 2:
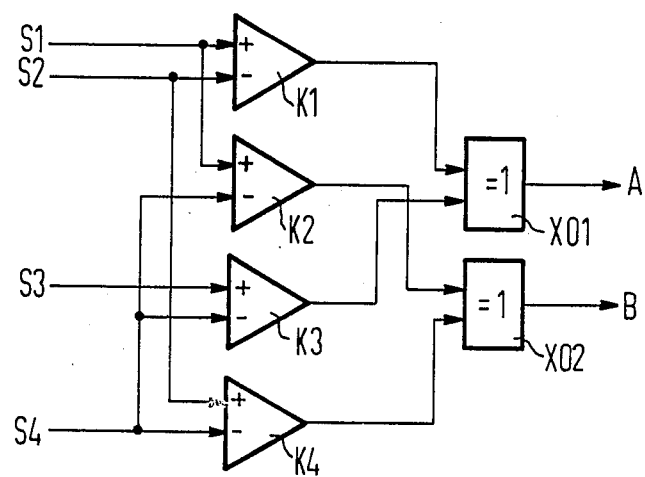
FIG. 2 shows the frequency doubling circuit according to the invention.

FIG. 1 shows the sinusoidal or cosinusoidal output signals of a known angular step generator. The signals are a sinusoidal signal S1, the inverted sinusoidal signal S2, the cosinusoidal signal S3 and the inverted cosinusoidal signal S4. In contrast to the cosinusoidal signal S3, S4, which are marked with dashes, the sinusoidal signals S1, S2 are respectively out-of-phase by 90°.

The frequency doubling circuit according to the invention is comprised of four comparators K1-K4 and two exclusive or gates X01, X02. The sinusoidal signal S1 is located at the non-inverting inputs of the first and the second comparator K1, K2. The inverted sinusoidal signal S2 is located at the inverting input of the first comparator K1 and not at the non-inverting input of the fourth comparator K4. The cosinusoidal signal S3 is located at the non-inverting input of the third comparator K3, and the inverted cosinusoidal signal S4 at the inverting inputs of the second, third and fourth comparators K2-K4.

A logical "1" is thus emitted from the first comparator K1, as long as the sinusoidal signal S1 is positive in comparison to the inverted sinusoidal signal S2. The second comparator K2 emits a logical "1," as long as the sinusoidal signal S1 is positive in comparison to the inverted cosinusoidal signal S4. The third comparator K3 emits a logical "1," as long as the cosinusoidal signal S3 is positive in comparison to the inverted cosinusoidal signal S4. And finally, the fourth comparator K4 emits a logical "1," as long as the inverted sinusoidal signal S2 is positive in comparison to the inverted cosinusoidal signal S4. Otherwise, the comparators K1-K4 will emit a logical "0."

The outputs of the first and the third comparator K1, K3 are connected to the inputs of the first exclusive or gate X01. The outputs of the second and the fourth comparator K2, K4 are connected to the inputs of the second exclusive or gate X02. The two exclusive or gates X01, X02 emit two 90° out-of-phase output signal A, B.

The output signals A, B have twice the frequency of the sinusoidal or cosinusoidal signals S1-S4 or the square-wave signals which can be formed therewith. Further, the output signals A, B have a 1:1 pulse duty factor, so that the gate circuits, which normally are subsequently connected, can be used without alteration. Apart from this, the existing angular step generators and glass scales or impulse disks can be used without alteration, provided they emit a sinusoidal signal.

What is claimed is:

1. A frequency doubling circuit for noninverted and inverted sinusoidal and cosinusoidal signals which are emitted by an angular step generator comprising;

four comparators arranged with the sinusoidal signal applied to the noninverting inputs of the first and the second of the four comparators, and the inverted sinusoidal signal applied to the inverting input of the first comparator and to the noninverting input of the fourth comparator, and the cosinusoidal signal applied to the non-inverting input of the third comparator, and the inverted cosinusoidal signal applied to the inverting inputs of the second, third and fourth comparators;

first and second exclusive Or gates each having the inverted cosinusoidal signals applied to an input thereto with the outputs of the first and third comparators being applied to the input of the said first exclusive Or gate and the outputs of the second and fourth comparators being applied to the input of the second exclusive Or gate, which provides at their outputs two 90° out-of-phase output signals.

2. A frequency doubling circuit in accordance with claim 1 wherein said output signals are each at a frequency which is twice the frequency of either of said signals applied to said first and second comparators.

* * * * *